(12) United States Patent
Mouret et al.

(10) Patent No.: US 12,231,105 B2
(45) Date of Patent: *Feb. 18, 2025

(54) SWITCHABLE TERMINATION RESISTANCE CIRCUIT

(71) Applicant: NXP USA, INC., Austin, TX (US)

(72) Inventors: Guillaume Mouret, Portet-sur-Garonne (FR); Alexis Nathanael Huot-Marchand, Labastidette (FR)

(73) Assignee: NXP USA, Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/295,540

(22) Filed: Apr. 4, 2023

(65) Prior Publication Data

US 2023/0353129 A1    Nov. 2, 2023

(30) Foreign Application Priority Data

Apr. 29, 2022  (EP) ..................... 22305641

(51) Int. Cl.
  *H03H 11/28*  (2006.01)
  *H03F 3/16*  (2006.01)
(52) U.S. Cl.
  CPC ............. *H03H 11/28* (2013.01); *H03F 3/16* (2013.01)
(58) Field of Classification Search
  CPC ....... H03H 11/28; H03F 3/16; H04L 25/0266; H04L 25/0278; H04L 25/0298; H04L 25/0272; H03K 17/687; H03K 17/102
  See application file for complete search history.

(56) References Cited

U.S. PATENT DOCUMENTS

| 4,713,827 | A | 12/1987 | Lauffer et al. |
| 6,078,204 | A | 6/2000 | Cooper et al. |

(Continued)

FOREIGN PATENT DOCUMENTS

| CN | 212183126 U | 12/2020 |
| EP | 0818734 B1 | 5/2003 |
| JP | 2015122656 A | 7/2015 |

OTHER PUBLICATIONS

U.S. Appl. No. 18/295,557, filed Apr. 4, 2023, entitled "Switchable Termination Resistance Circuit".

(Continued)

*Primary Examiner* — Metasebia T Retebo

(57) ABSTRACT

A switchable termination resistance circuit for a transceiver physical layer interface. Example embodiments include a switchable termination resistance circuit for a transmission line transceiver, the switchable termination resistance circuit comprising: first and second terminals for connection to a transmission line; first and second NMOS termination resistance switches having source connections connected together at a midpoint node and gate connections connected to an input node; a first resistor connected between the first terminal and a drain connection of the first NMOS termination resistance switch; a second resistor connected between the second terminal and a drain connection of the second NMOS termination resistance switch; a Zener diode having a cathode side connected to the input node and an anode side connected to the midpoint node; and a branch comprising a second Zener diode, a branch diode, a branch NMOS switch and a branch PMOS switch in a series connected arrangement between the midpoint node and a ground line.

12 Claims, 15 Drawing Sheets

(56) References Cited

U.S. PATENT DOCUMENTS

| | | | |
|---|---|---|---|
| 6,100,713 A | 8/2000 | Kalb et al. | |
| 6,480,030 B1 | 11/2002 | Taguchi | |
| 6,590,413 B1 * | 7/2003 | Yang | H04L 25/0298 |
| | | | 327/108 |
| 7,589,574 B2 * | 9/2009 | Zhu | H03K 17/223 |
| | | | 327/143 |
| 10,333,744 B2 | 6/2019 | Gscheidle | |
| 11,394,585 B2 | 7/2022 | Hayashi et al. | |
| 2014/0256276 A1 | 9/2014 | Li et al. | |

OTHER PUBLICATIONS

U.S. Appl. No. 18/882,046, filed Sep. 11, 2024, entitled "Transceiver Physical Layer Interface".

Non-final office action dated Jan.3, 2025 in U.S. Appl. No. 18/295,557.

* cited by examiner

SWITCHABLE TERMINATION RESISTANCE CIRCUIT

CROSS-REFERENCE TO RELATED APPLICATIONS

This application claims the priority under 35 U.S.C. § 119 of European Patent application no. 22305641.7, filed on 29 Apr. 2022, the contents of which are incorporated by reference herein.

FIELD

The disclosure relates to a switchable termination resistance circuit for a transceiver physical layer interface.

BACKGROUND

In a communication system comprising a pair of transceivers passing signals along a transmission line, a termination resistance at each transceiver serves to reduce reflections along the transmission line.

An example of a communication system comprising a pair of transceivers connected by a transmission line is illustrated in FIG. 1. The system 100 comprises first and second transceivers 101, 102 connected by a transmission line 103, which in this example comprises a twisted wire pair. Each transceiver 101, 102 is the physical interface of a transformer physical layer (TPL). The transmission line 103 is isolated from the transceivers 101, 102 by a transformer 104a, 104b at either end of the transmission line 103. In the illustrated example, the first transceiver 101 is in transmit mode and the second transceiver 102 is in receive mode. Each transceiver 101, 102 comprises a pair of terminals TXP, TXN that connect to the transmission line 103 via respective transformers 104a, 104b. A termination resistance Rterm is connected between the terminals TXP, TXN. Decoupling capacitors Cdec are connected between each of the terminals TXP, TXN and ground. Each transceiver 101, 102 comprises two receiver amplifiers RX and one transmitter amplifier TX connected between the terminals TXP, TXN and a control module 105, 106.

FIG. 2 illustrates schematically the differential voltage between terminals TXP, TXN as a function of time at a transmitter during transmission of a logic level 1 followed by a logic level 0. For a logic level 1, the transmitter applies a positive differential voltage during a first phase followed by a negative differential voltage during a second phase, and then followed by a zero differential voltage during a third phase. The duration of the first and second phases is approximately the same, while the duration of the third phase is around twice that of each the first and second phases. For a logic level 0, the transmitter first applies a negative differential voltage during a first phase, followed by a positive differential voltage in a second phase and a zero differential voltage in a third phase. Similar to that for a logic level 1, for the logic level 0 the third phase is around twice the length of each of the first and second phases.

To mitigate line attenuation, the differential voltage applied to the transmission line is made as high as possible. The power consumption of the transmitter mostly depends on the differential voltage applied and the bus load representing the equivalent resistance seen across the output connections TXP, TXN, which will include the termination resistance Rterm at the receiver side.

During the first and second phases, the transmitter power consumption will increase if the termination resistance is connected at the transmitter side. To reduce this, the termination resistance may be disconnected during the first and second phases to save on power consumption by the transmitter. An example of a switchable termination resistance to reduce losses when transmitting a signal along the transmission line is disclosed in WO 88/03731 A1, in which a termination resistor is switched into a transceiver circuit for a set length of time after a transmit/receive signal is enabled that is sufficient to receive the leading edge of a data bit over a transmission line.

For line transmission systems where operation at high voltages under electromagnetic interference is required, for example in automotive applications, the design of a switchable termination resistance may be more complex due to the limited maximum acceptable gate voltage of MOSFETs, high electromagnetic interference and high common mode voltages.

SUMMARY

According to a first aspect there is provided a switchable termination resistance circuit for a transmission line transceiver, the switchable termination resistance circuit comprising:
first and second terminals for connection to a transmission line;
first and second NMOS termination resistance switches having source connections connected together at a midpoint node and gate connections connected to an input node;
a first resistor connected between the first terminal and a drain connection of the first NMOS termination resistance switch;
a second resistor connected between the second terminal and a drain connection of the second NMOS termination resistance switch;
a Zener diode having a cathode side connected to the input node and an anode side connected to the midpoint node; and
a branch comprising a second Zener diode, a branch diode, a branch NMOS switch and a branch PMOS switch in a series connected arrangement between the midpoint node and a ground line.

An advantage of the switchable termination resistance is that power consumption can be reduced by connecting the termination resistance only when required to reduce reflections. An advantage of the branch as part of the circuit is that high fluctuating common mode voltages due to electromagnetic interference on the transmission line can be more readily accommodated without subjecting other components to excessive voltages.

A cathode of the second Zener diode may be connected to the midpoint node, an anode of the branch diode connected to an anode of the second Zener diode, a drain of the branch NMOS switch connected to a cathode of the branch diode, a source of the branch PMOS switch connected to a source of the branch NMOS switch and a gate and drain of the branch PMOS switch connected to the ground line.

A transceiver may comprise:
first and second terminals for connection to a transmission line;
a control module;
an amplifier module connected between the control module and the first and second terminals;
a switchable termination resistance circuit according to the first aspect connected between the first and second terminals; and a driving circuit configured to provide a gate voltage to the input node of the switchable termination resistance circuit, wherein the control module is configured to provide signals to and from the amplifier module and a termination resistance enable signal to the driving circuit.

In the transceiver, the driving circuit may comprise:

a first diode connected between a supply voltage line and the input node, the first diode having a cathode connected to the input node; and a second diode connected between the input node and a ground voltage line, the second diode having an anode connected to the input node.

The driving circuit may comprise first, second and third NMOS switches having source connections connected to the ground voltage line, the control module connected to provide the termination resistance enable signal to the gate of the second NMOS switch and to a gate of the branch NMOS switch and an inverse of the termination resistance enable signal to the gates of the first and third NMOS switches, the drain of the third NMOS switch connected to a cathode of the second diode.

The driving circuit may further comprise first, second, third, fourth, fifth and sixth PMOS switches, wherein:

a gate connection of the first PMOS switch is connected to a drain connection of the second PMOS switch;

a gate connection of the second PMOS switch is connected to a drain connection of the first PMOS switch;

source connections of the first, second and third PMOS switches are connected to the supply voltage line;

a gate connection of the third PMOS switch is connected to the drain connection of the second PMOS switch;

a source connection of the fourth PMOS switch is connected to the drain connection of the first PMOS switch;

a drain connection of the fourth PMOS switch is connected to a drain connection of the first NMOS switch;

a gate connection of the fourth PMOS switch is connected to a gate connection of the fifth PMOS switch;

a source connection of the fifth PMOS switch is connected to the drain connection of the second PMOS switch;

a drain connection of the fifth PMOS switch is connected to a drain connection of the second NMOS switch;

gate connections of the fifth and sixth PMOS switches are connected together;

a source connection of the sixth PMOS switch is connected to a drain connection of the third PMOS switch; and a drain connection of the sixth PMOS switch is connected to an anode connection of the first diode.

The transceiver may comprise a plurality of switchable termination resistance circuits according to the first aspect connected in parallel between the first and second terminals.

A transmission system may comprise:

first and second transceivers as defined above; and a transmission line connected to first and second terminals of each of the first and second transceivers.

The transmission system may comprise first and second pairs of capacitors at each end to isolate the first and second transceivers from the transmission line.

According to a second aspect there is provided a method of operating a transceiver as defined above, the method comprising transmitting a data bit over the transmission line by:

the control module providing first and second pulses to the amplifier module to drive respective positive and negative differential voltage levels across the first and second terminals during respective first and second time periods; and the control module providing a termination resistance enable signal to the driving circuit and, while the termination resistance enable signal is provided, maintaining a zero differential voltage level across the first and second terminals during a third time period.

The termination resistance is disconnected while the first and second pulses are provided and is connected during the third pulse, thereby reducing losses during the first and second pulses and reducing reflections during the third time period.

The method may further comprise:

the control module removing the termination resistance enable signal from the driving circuit; and repeating the method for transmission of a subsequent data bit over the transmission line.

BRIEF DESCRIPTION OF DRAWINGS

Embodiments will be described, by way of example only, with reference to the drawings, in which.

Figure 1:
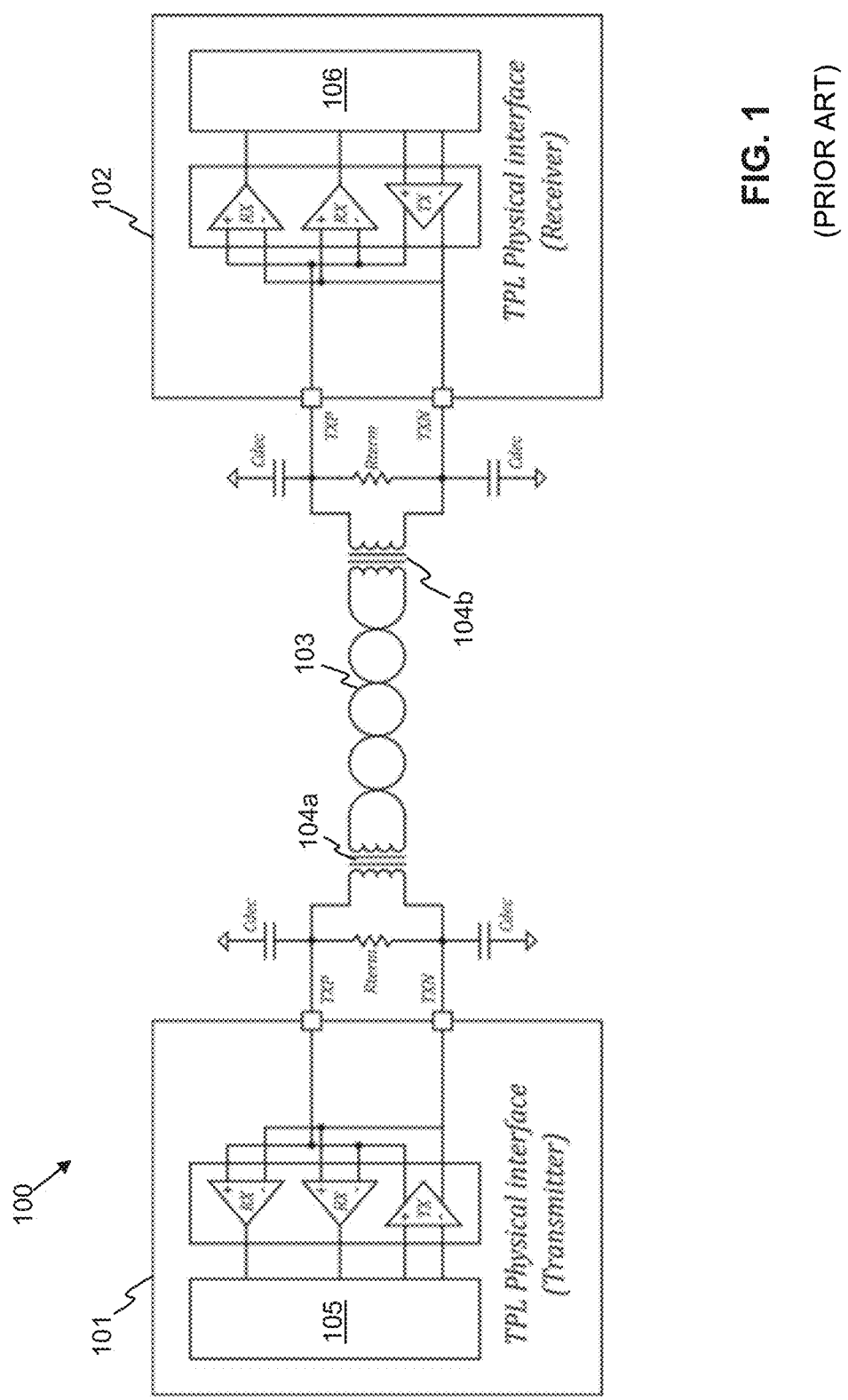
FIG. 1 is a diagram of a communication system comprising a pair of transceivers connected with a transmission line.

It should be noted that the Figures are diagrammatic and not drawn to scale. Relative dimensions and proportions of parts of these Figures may be shown exaggerated or reduced in size, for the sake of clarity and convenience in the drawings. The same reference signs are generally used to refer to corresponding or similar feature in modified and different embodiments.

DETAILED DESCRIPTION OF EMBODIMENTS

Figure 3:
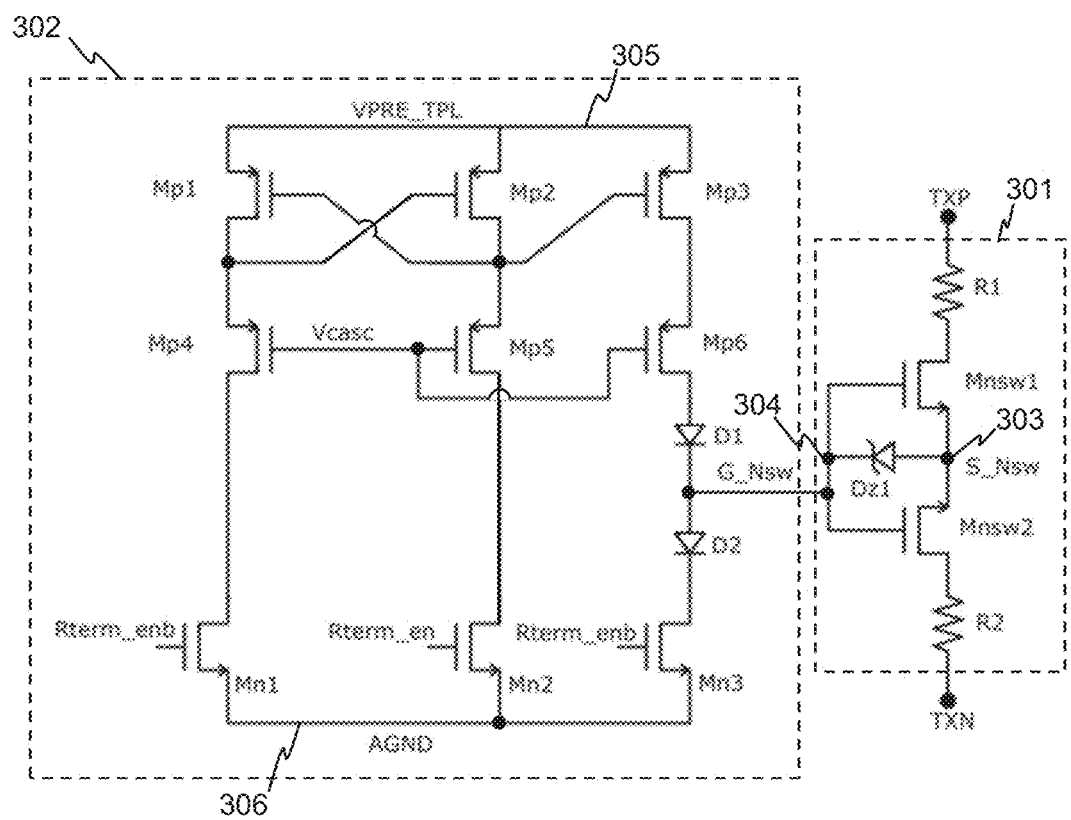
FIG. 3 is a simplified schematic diagram of a switchable termination resistance circuit and associated driving circuit for a transmission line communication system.

FIG. 3 illustrates a schematic diagram of an example switchable termination resistance circuit 301 with an associated driving circuit 302. The switchable termination resistance circuit 301 is connected between first and second terminals TXP, TXN of a transceiver, such as either of the transceivers 101, 102 illustrated in FIG. 1. The switchable termination resistance circuit 301 comprises first and second resistors R1, R2 connected to respective first and second terminals TXP, TXN. First and second NMOS termination resistance switches Mnsw1, Mnsw2 are connected in series between the first and second resistors R1, R2. Source connections of the termination resistance switches Mnsw1, Mnsw2 are connected together and drain connections of the termination resistance switches Mnsw1, Mnsw2 are connected to the respective first and second resistors R1, R2. Switching on the first and second termination resistance switches Mnsw1, Mnsw2 by applying a gate voltage to the gates of the termination resistance switches Mnsw1, Mnsw2 connects the first resistor R1 to the second resistor R2 via the first and second termination resistance switches Mnsw1, Mnsw2, thereby connecting a termination resistance between the first and second terminals TXP, TXN. The total termination resistance comprises the first and second resistors R1, R2 in series, together with the source-drain resistances of the first and second termination resistance switches Mnsw1, Mnsw2 (which may be a few Ohms). Switching off the first and second termination resistance switches Mnsw1, Mnsw2 disconnects the termination resistance from the first and second terminals TXP, TXN, leaving the connection between terminals TXP, TXN open circuit.

Gate connections of the first and second termination resistance switches Mnsw1, Mnsw2 are connected to an input node 304, which is connected to an output of the driving circuit 302 for driving the switchable termination resistance circuit 301. Source connections of the first and second termination resistance switches Mnsw1, Mnsw2 are connected together at a midpoint node 303 of the switchable termination resistance circuit 301. A Zener diode Dz1 is connected between the input node 304 and the midpoint node 303, the cathode of the Zener diode Dz1 being connected to the input node 304. The Zener diode Dz1 maintains a gate-source voltage across the first and second termination resistance switches Mnsw1, Mnsw2 within a set voltage range defined by the breakdown voltage of the Zener diode. The Zener diode Dz1 thereby allows the switchable termination resistance circuit 301 to operate in the presence of electromagnetic interference, which may result in high voltages being induced across the first and second terminals TXP, TXN. The Zener diode may for example clamp the gate-source voltage across the termination resistance switches Mnsw1, Mnsw2 to 5V when the switchable terminal resistance circuit 301 is enabled.

During normal operation in the absence of electromagnetic interference, the common mode voltage on the transmission line connected to the first and second connections TXP, TXN may for example be around 2.5 V. To operate the switches Mnsw1, Mnsw2 a voltage at the input node 304 will need to be higher than around 3.5 V, but lower than the breakdown voltage of the Zener diode Dz1.

The driving circuit 302 provides the gate voltage G_Nsw to the input node 304 that operates the first and second termination resistance switches Mnsw1, Mnsw2. The driving circuit 302 is connected between a supply voltage line 305 providing a supply voltage VPRE_TPL (for example 7V) and a ground voltage line 306 at a ground voltage AGND (for example 0V).

The driving circuit 302 operates as a level shifter, allowing a low voltage input signal Rterm_en, Rterm_enb, to drive a higher voltage output signal G_Nsw, and allows the output voltage to float along with the voltage level at the midpoint node 303 of the switchable termination resistance circuit 301. To allow the output voltage to float, the driving circuit 302 comprises first and second diodes D1, D2 connected to the input node 304, the first diode D1 having its cathode connected to the input node 304 and the second diode D2 having its anode connected to the input node 304. Diodes D1, D2 prevent current flowing back into the driving circuit 302 from the switchable termination resistance circuit 301 in the presence of high levels of electromagnetic interference.

First, second and third NMOS switches Mn1, Mn2, Mn3 of the driving circuit 302 have source connections connected to the ground voltage line 305 and gate connections connected to receive a termination resistance enable signal Rterm_en or its inverse, Rterm_enb. Gate connections of the first and third NMOS switches Mn1, Mn3 receive Rterm_enb, while the second NMOS switch Mn2 receives Rterm_en.

The driving circuit 302 further comprises first, second, third, fourth, fifth and sixth PMOS switches Mp1-Mp6. A gate connection of the first PMOS switch Mp1 is connected to a drain connection of the second PMOS switch Mp2. A gate connection of the second PMOS switch Mp2 is connected to a drain connection of the first PMOS switch Mp1. Source connections of the first, second and third PMOS switches are connected to the supply voltage line 304. A gate connection of the third PMOS switch Mp3 is connected to the drain connection of the second PMOS switch Mp2.

A source connection of the fourth PMOS switch Mp4 is connected to the drain connection of the first PMOS switch Mp1 and a drain connection of the fourth PMOS switch Mp4 is connected to a drain connection of the first NMOS switch Mn1. A gate connection of the fourth PMOS switch Mp4 is connected to a gate connection of the fifth PMOS switch Mp5. A source connection of the fifth PMOS switch Mp5 is connected to the drain connection of the second PMOS switch Mp2. A drain connection of the fifth PMOS switch Mp5 is connected to a drain connection of the second NMOS switch Mn2.

Gate connections of the fifth and sixth PMOS switches Mp5, Mp6 are connected together. A source connection of the sixth PMOS switch Mp6 is connected to a drain connection of the third PMOS switch Mp3. A drain connection of the sixth PMOS switch Mp6 is connected to an anode connection of the first diode D1.

A drain connection of the third NMOS switch Mn3 is connected to the cathode connection of the second diode D2.

To turn on the termination resistance, the enable signal Rterm_en is provided to the second NMOS switch Mn2 and its inverse to the first and third NMOS switches Mn1, Mn3. The voltage applied at the input node 304 is then the supply voltage VPRE_TPL minus one diode voltage, i.e., the voltage across the first diode D1. The supply voltage VPRE_TPL needs to be sufficient to pull the gates of the termination switches Mnsw1, Mnsw2 but lower than that required to drive current through the Zener diode Dz1.

To turn off the termination resistance, the third NMOS switch Mn3 is turned on with Rterm_enb, which pulls down the drain of the NMOS switch Mn3 and the gate voltage at the input node 304 to one diode voltage about ground, thereby turning off the termination resistance switches Mnsw1, Mnsw2.

Figure 4:
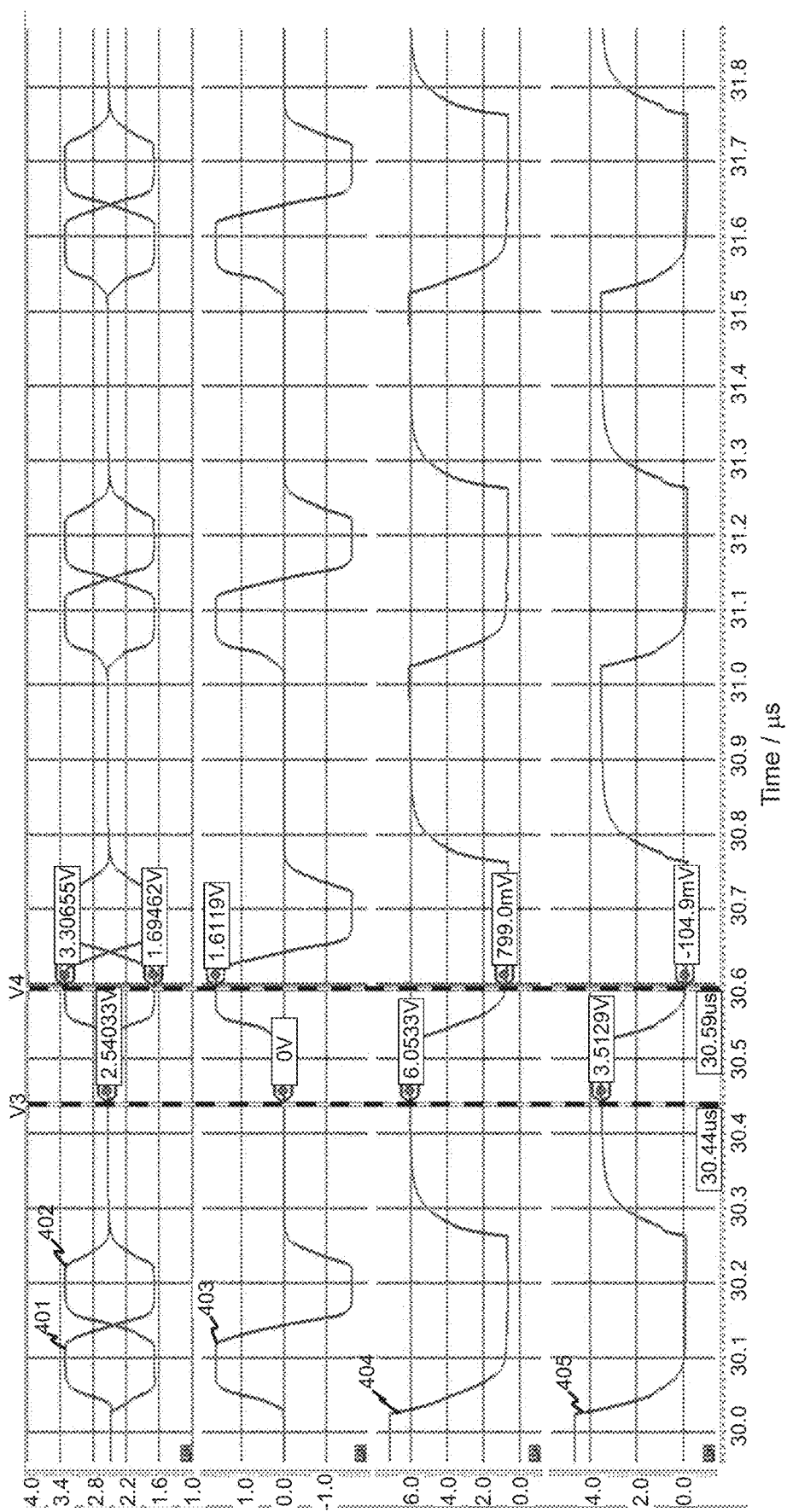
FIG. 4 is a series of plots of voltage as a function of time for transmission of a series of data bits

FIG. 4 illustrates an example series of plots of voltage as a function of time at various points in the circuit of FIG. 3, including the voltages V_TXP 401 and V_TXN 402 at respective terminals TXP, TXN, the differential voltage V_TXP-V_TXN 403 between terminals TXP, TXN, the voltage V_Gnmos 404 on the gates of the termination resistance switches Mnsw1, Mnsw2, and the gate-source voltage V_GS_Nmos 405 across the termination resistance switches Mnsw1, Mnsw2.

During the first and second phase of the transmission of sequential bits, the voltage V_Gnmos 404 falls to around 0.6V and the resulting gate-source voltage 405 across the first and second termination resistance switches Mnsw1, Mnsw2 is around −0.2V, causing the first and second termination resistance switches Mnsw1, Mnsw2 to be off. In this example, the threshold of the termination resistance switches is around 1V. During the third phase, where the differential voltage 403 is zero, the gate voltage V_Gnmos 404 rises to around 6V and the gate-source voltage V_GS_Nmos 405 across the termination resistance switches Mnsw1 Mnsw2 rises to around 3.5V, resulting in the termination resistance being connected between the terminals TXP, TXN. The presence of the termination resistance reduces the effect of any rebound signals in the transmission line during the third phase.

Figure 5:
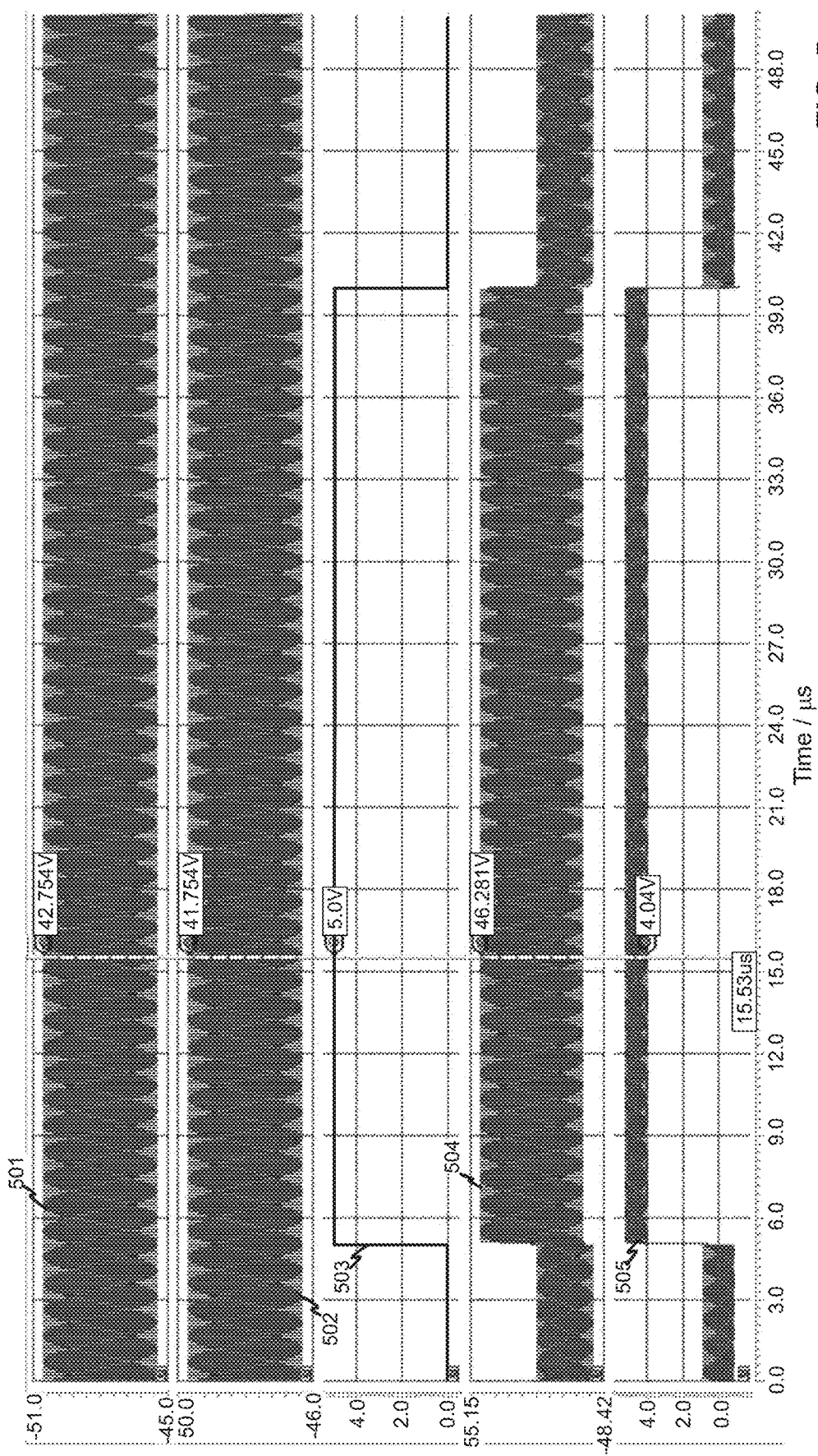
FIG. 5 is a series of plots of voltage as a function of time illustrating the effect of electromagnetic interference.

FIG. 5 illustrates simulated voltage measurements in the presence of electromagnetic interference, which results in perturbations of around +/−40V along the transmission line. The plots of voltage as a function of time show voltages V_TXP 501, V_TXN 502 at respective terminals TXP, TXN, the termination resistance enable signal Rterm_en 503, the gate voltage V_Gnmos 504 at the termination resistance switches Mnsw1, Mnsw2 and the gate-source voltage V_GS_nmos 505 across the termination resistance switches Mnsw1, Mnsw2. The voltages 501, 502 on the terminals TXP, TXN oscillate rapidly as a result of the electromagnetic interference. This results in oscillation of the gate voltage V_Gnmos 504 but, because the midpoint node 303 floats, the gate-source voltage V_GS_nmos across the termination resistance switches Mnsw1, Mnsw2 maintains the switches in the required state corresponding to the enable signal 503.

When the enable signal 503 is in a low state, i.e., around 0V, the gate-source voltage 505 across the termination resistance switches oscillates around +/−0.6V, resulting in the termination resistance being disconnected. When the enable signal 503 is in a high state, in this case around 5V, the gate-source voltage 505 across the termination resistance switches rises to between around 4V and 5V, resulting in the termination resistance being connected to the terminals TXP, TXN. Disabling the enable signal 503 then results in the gate-source voltage 505 returning to around +/−0.6V, thereby deactivating the termination resistance. The termination resistance circuit is therefore shown to work as required even during electromagnetic interference resulting in perturbations as high as +/−40V on the transmission line.

Figure 6:
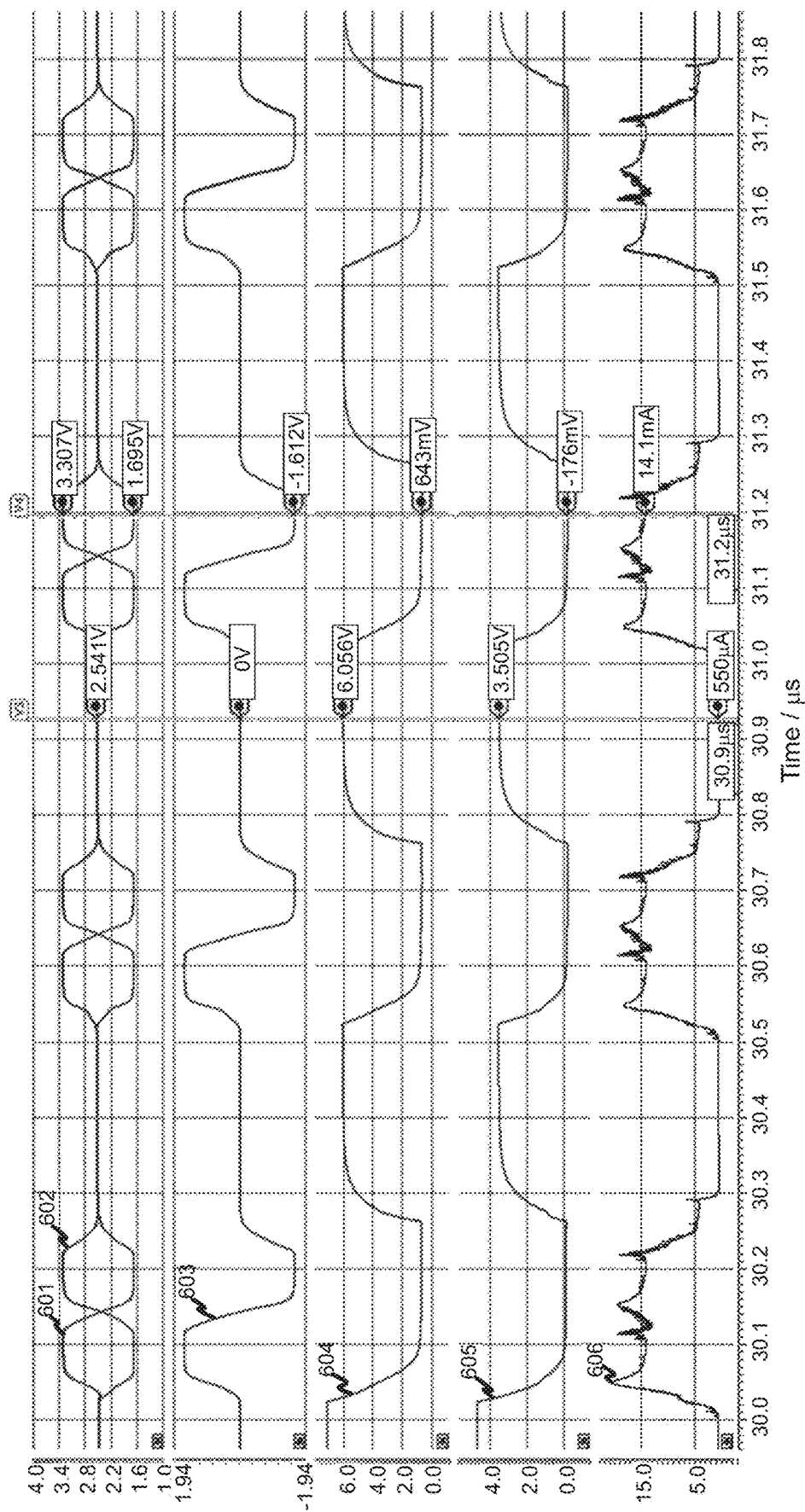
FIG. 6 is a series of plots of voltage and current as a function of time for transmission of a series of data bits for a transmission system with a switchable termination resistance.

FIG. 6 illustrates a further example series of plots of voltage as a function of time at various points in the circuit of FIG. 3, including the voltages V_TXP 601 and V_TXN 602 at the respective terminals TXP, TXN, the differential voltage V_TXP-V_TXN 603 between the terminals TXP, TXN, the voltage V_Gnmos 604 on the gates of the termination resistance switches Mnsw1, Mnsw2, and the gate-source voltage V_GS_Nmos 605 across the termination resistance switches Mnsw1, Mnsw2. Also shown in FIG. 6 is the current supply I_supply 606, which increases to around 15 mA during the positive and negative phases of the transmission of each bit on the transmission line for a differential voltage of around 1.6V. The main portion of current consumption is that during the first and second phases, which cover around half of the total period for transmission of each bit. The average current consumption over each bit is therefore around 7.5 mA.

Figure 7:
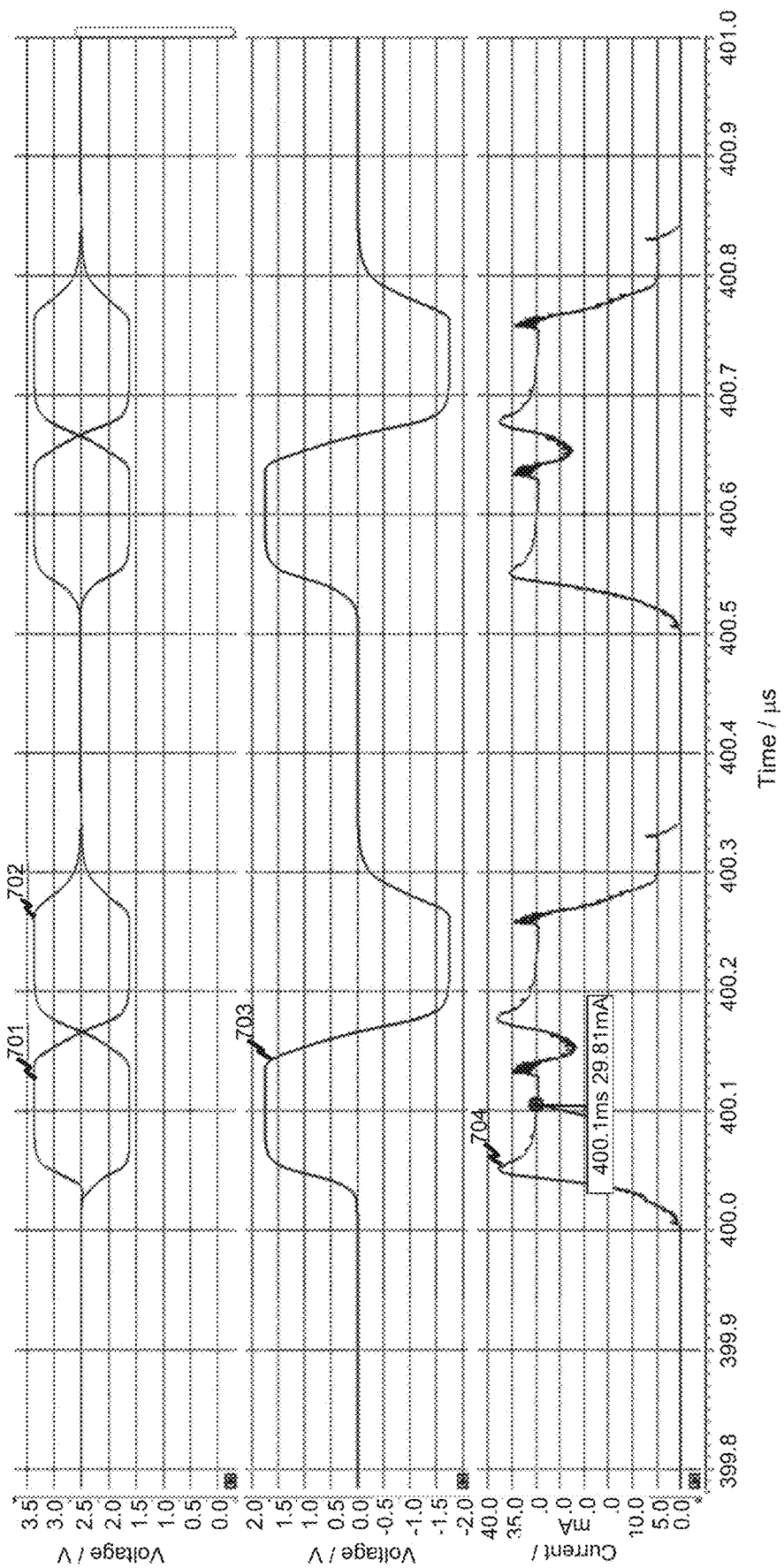
FIG. 7 is a series of plots of voltage and current as a function of time for transmission of a series of data bits for a transmission system with a non-switchable termination resistance.

FIG. 7 illustrates for comparison a series of plots showing voltages V_TXP 701, V_TXN 702 at terminals TXP, TXN, the resulting differential voltage 703 and current 704 as a function of time for a transmission line system without a switchable termination resistance. For a similar differential voltage of around +/−1.6V, the average current consumption during the first and second phases is around 30 mA, double that of the current consumption of that with the switchable termination resistance. The use of a switchable termination resistance can therefore result in a halving of the overall current consumption.

A problem with incorporating termination resistances in integrated circuits is that the value of resistance may vary significantly, for example by around +/−20%. This can lead to inaccuracies in operation of the transceiver. To improve matching of the termination resistance to a desired value, a plurality of parallel connected termination resistance circuits may be provided, one of which is selected as the closest to the desired value. The chosen resistance may therefore more closely match the desired value. As an example, if a desired value for the termination resistance is Rterm, a first termination resistance circuit with nominal values of 0.8 Rterm/2 for each resistor R1 and R2, a second termination resistance circuit with nominal values of Rterm/2 for R1 and R2 and a third termination resistance circuit with nominal values of 1.2 Rterm/2 for R1 and R2 may be provided and the one most closely matching the desired total termination resistance Rterm selected during manufacture.

Figure 2:
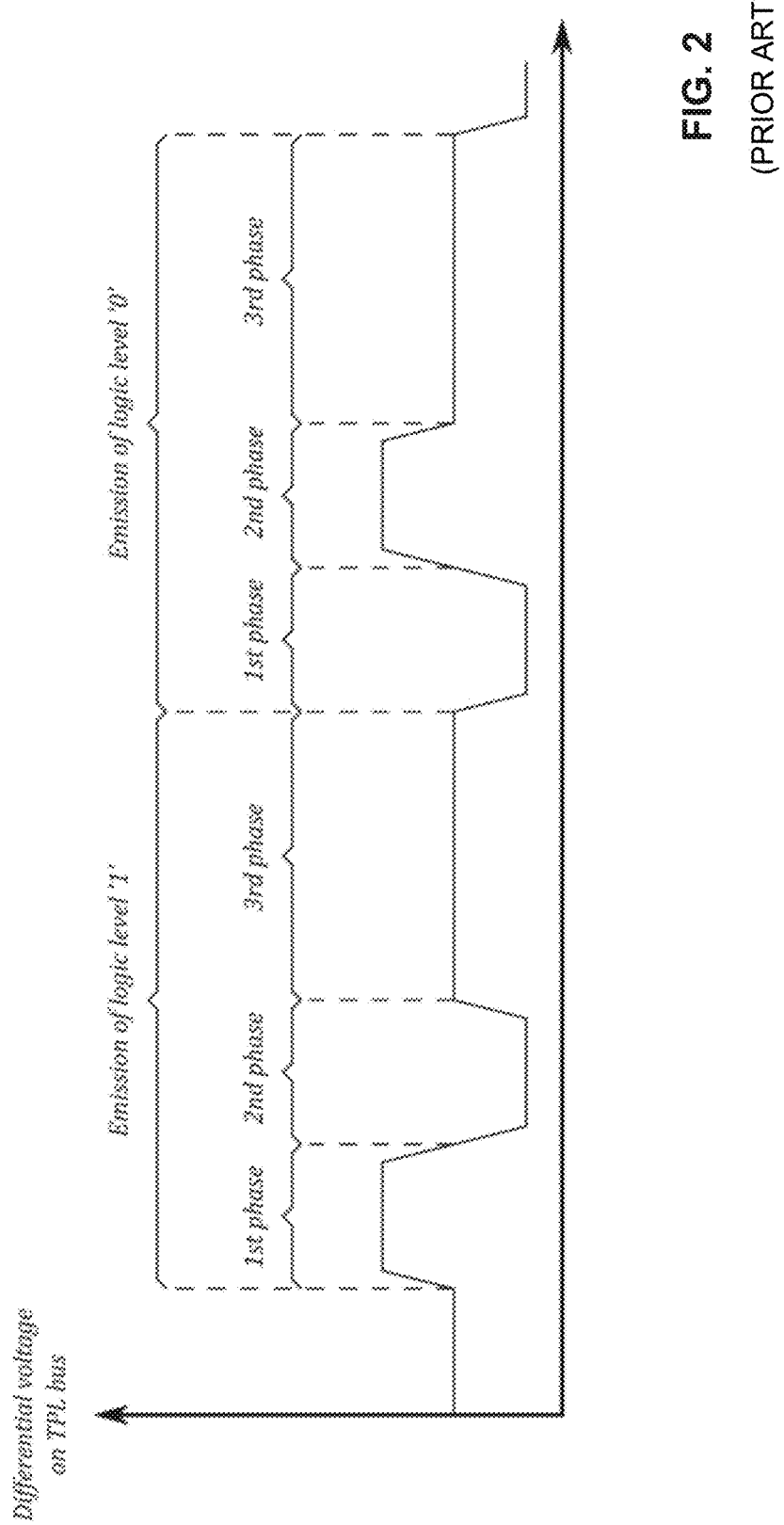
FIG. 2 illustrates a schematic illustration of differential voltage on a transmission line as a function of time.
Figure 8:
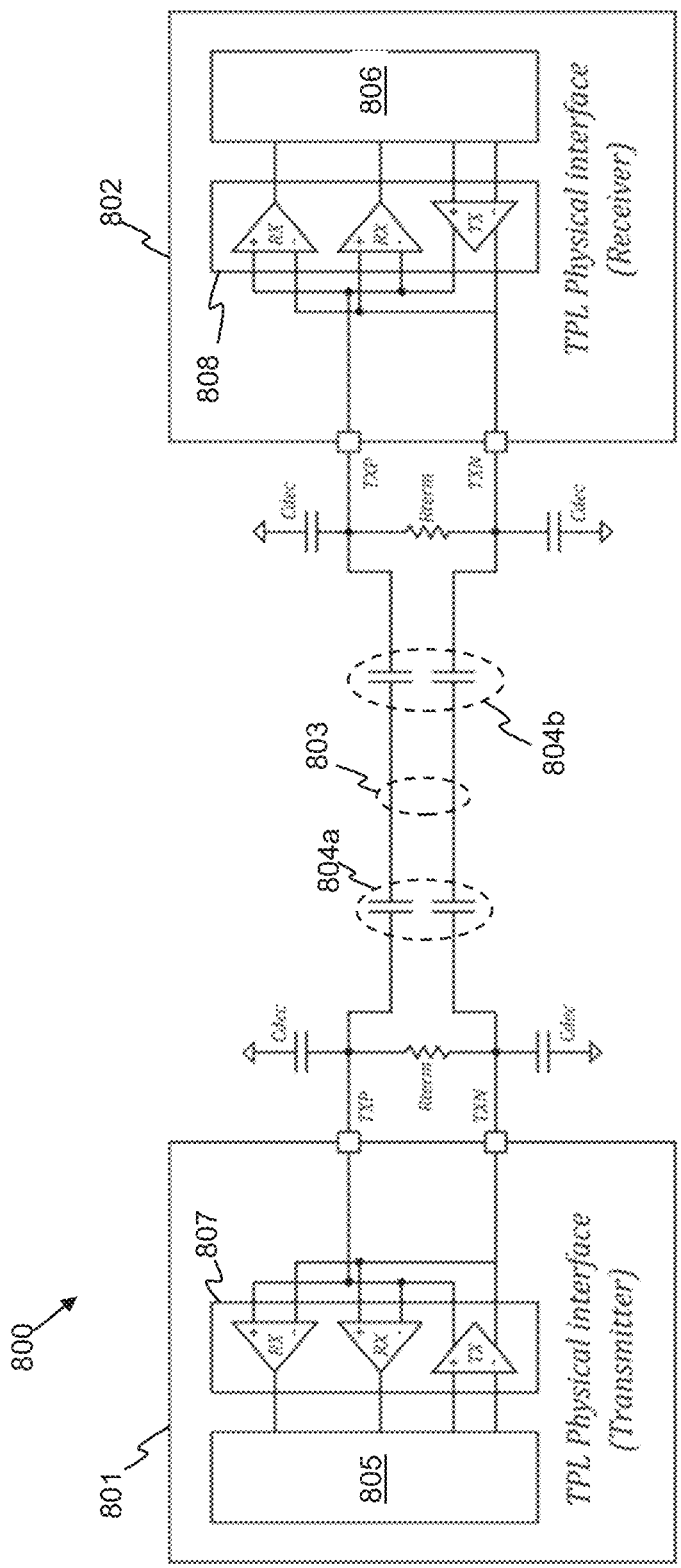
FIG. 8 is a schematic diagram of an example transmission system with a capacitively isolated transmission line.

FIG. 8 is a schematic diagram of an example communication system 800 similar to that of FIG. 1 but with the transmission line 803 isolated from the transceivers 802, 802 by pairs of capacitors 804a, 804b at each end of the transmission line 803 rather than by transformers. The transceivers 801, 802 are otherwise similar to those in FIG. 1, with control modules 805, 806 providing signals to and receiving signals from amplifier modules 807, 808 for transmission to and reception of signals from the transmission line 803. Transmission of data bits via the transmission line 803 operates in the same way as described above with reference to FIG. 2, i.e., with positive and negative differential voltage pulses in first and second phases followed by a zero differential voltage third phase.

Figure 9:
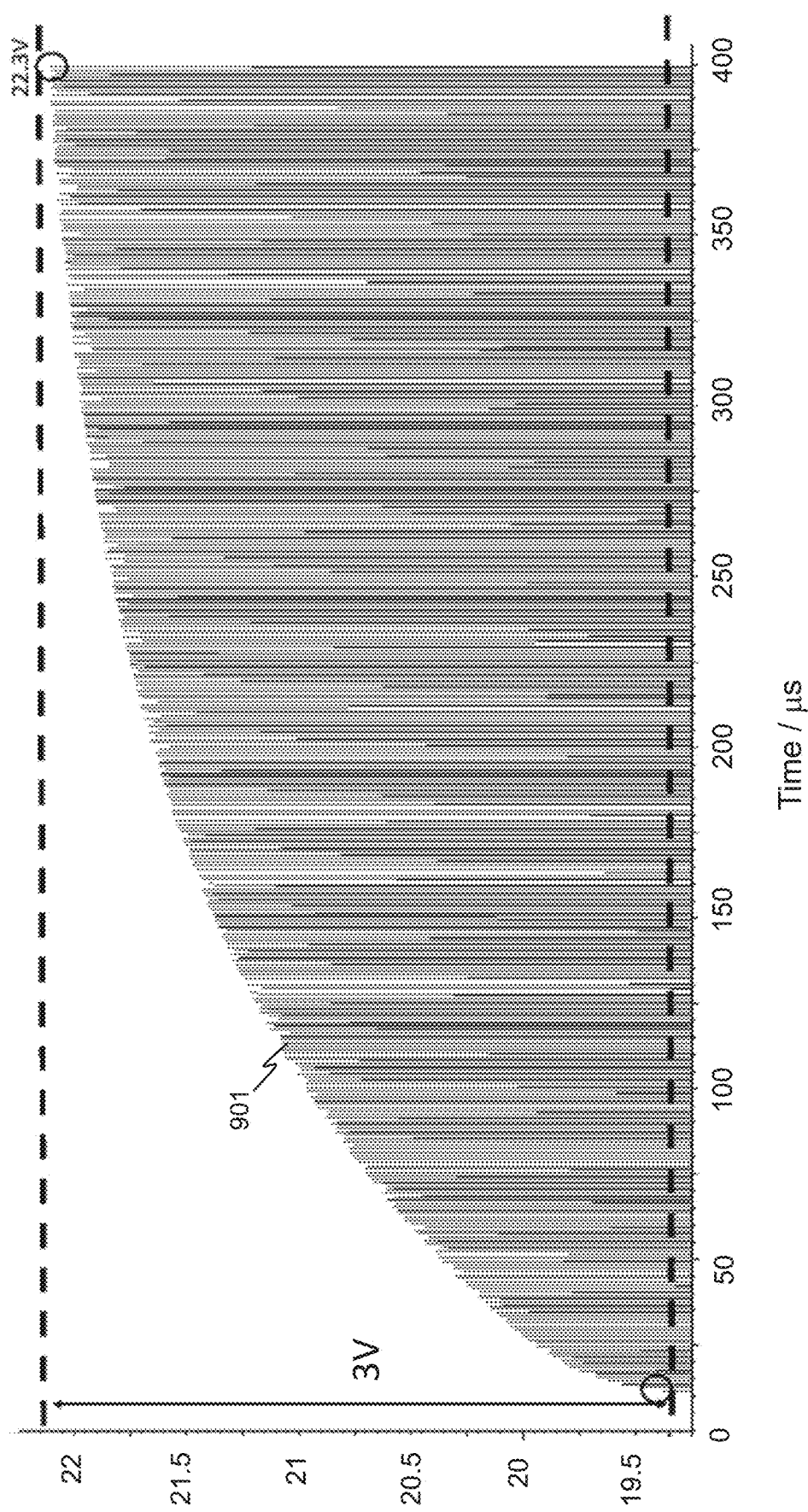
FIG. 9 is a plot of voltage as a function of time for a terminal of an example capacitively isolated transceiver.

A switchable termination resistance circuit 301 and associated driving circuit 302 as illustrated in FIG. 3 and described above may also be used in transceivers connected by a capacitively coupled transmission line. A problem with this, however, is that rectification will tend to occur of alternating voltages induced by electromagnetic interference on the transmission line, resulting in an offset being generated while the termination resistance is connected between the terminals TXP, TXN. This effect is illustrated in FIG. 9, which shows the voltage V_TXP 901 on the positive terminal TXP as a function of time during electromagnetic interference induced perturbations. An increase of around 3V is observed between the nominal 19.3V level and a 22.3V level resulting from this rectification effect over hundreds of cycles. The rectification effect will vary depending on the frequency and level of voltage induced by electromagnetic interference and can result in a problem for the transceiver interface if the induced voltages rise above a maximum acceptable level for the components used.

Figure 10:
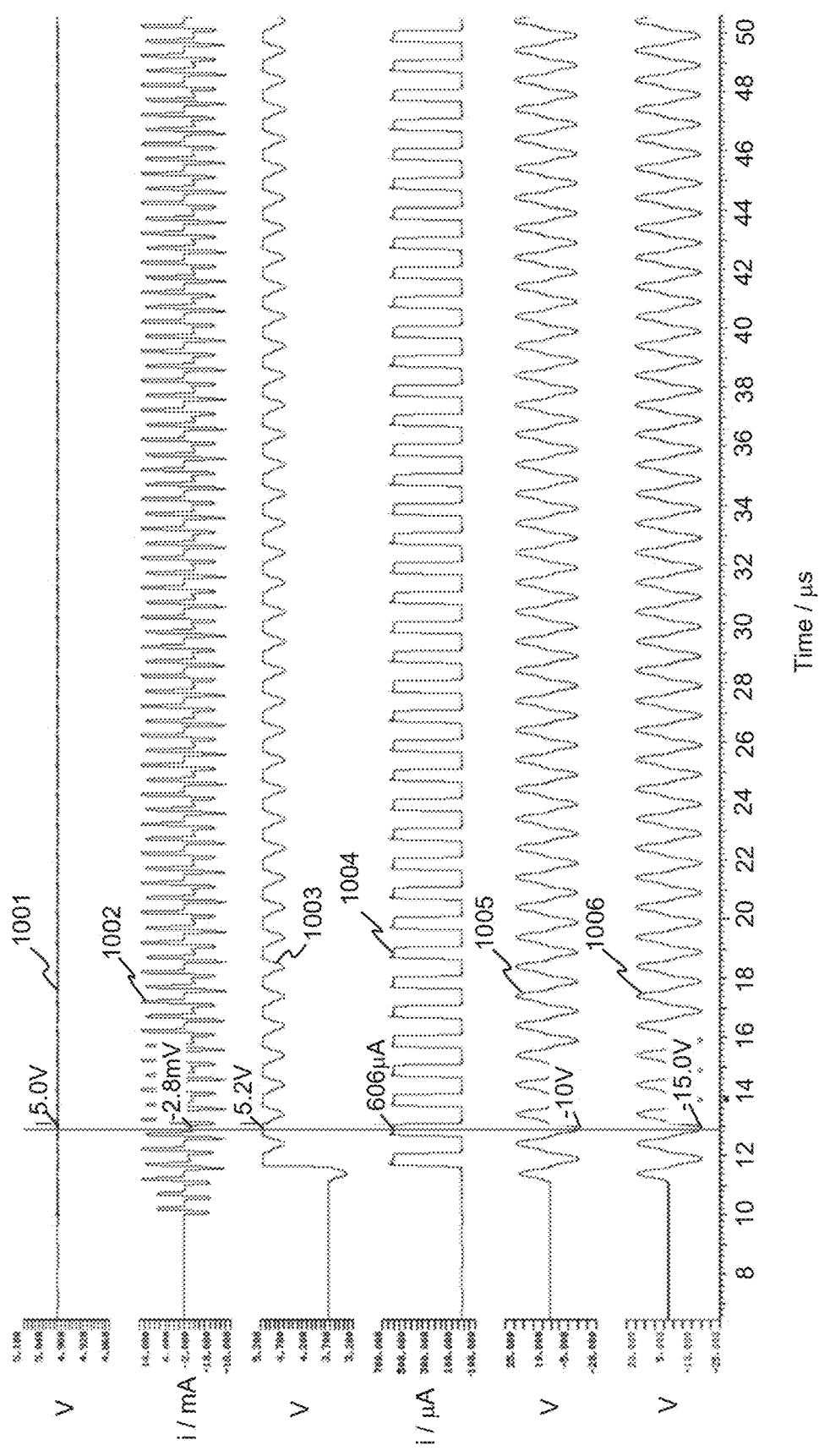
FIG. 10 is a series of plots of voltage and current for an example transceiver.

FIG. 10 illustrates a series of plots of current and voltage as a function of time to illustrate the effect of rectification due to electromagnetic interference. FIG. 10 shows: i) the Voltage enable signal 1001 of the termination resistance of the receiver (V_Rterm_en_Receiver); ii) the current 1002 flowing into the TXP pin of the Receiver (I_TXP_Receiver); iii) the Gate-Source voltage 1003 of the termination resistance switches (V_GS_SW_Receiver); iv) the Current 1004 supplied by Vpre_TPL supply of the Receiver (I_Vpre_TPL_Receiver); v) the Gate voltage 1005 of the termination resistance switch of the receiver (V_G_SW_Receiver); and vi) the Source voltage 1006 of the termination resistance switch of the receiver (V_S_SW_Receiver). A current 1004 of around 600 μA is intermittently injected from the driver circuit supply voltage line 305 (see FIG. 3) to the transmission line during successive negative cycles due to electromagnetic interference. This current passes through the third and sixth PMOS switches Mp3, Mp6 and the first diode D1 and into the transmission line, charging the external capacitances isolating the transmission line from the transceiver. One solution to this would be to reduce the injected current but this would negatively affect the speed of the switchable termination resistance circuit. Instead, a solution is proposed in the form of the switchable resistance circuit 1101 illustrated in FIG. 11. This has the same form as the circuit 301 shown in FIG. 3, with the addition of a branch 1107 connecting the midpoint node 1103 to a ground connection AGND. As with the example in FIG. 3, the driving circuit 1102 provides a gate voltage to the input node 1104 of the switchable termination resistance circuit 1101 in response to a termination resistance enable signal Rterm_en (and its inverse Rterm_enb). The driving circuit 1102 is connected between a supply voltage line 1105 and a ground line 1106. Operation of the driving circuit and its various components are as described above for FIG. 3.

The branch 1107 comprises a second Zener diode Dz2, a branch diode D3, a branch NMOS switch Mn4 and a branch PMOS switch Mp7 in a series connected arrangement between the midpoint node 1103 and ground AGND.

When the voltage at the midpoint node 1103 exceeds around 7V, current flows into the branch 1107, which reduces the charge build-up during each positive cycle resulting from electromagnetic interference.

The branch 1107 is only enabled when the termination resistance circuit is enabled, as the branch NMOS switch Mn4 has its gate connected to the termination resistance enable line Rterm_en.

The branch diode D3 prevents current flowing in the reverse direction when the voltage at the midpoint node 1103 turns negative.

The branch switch Mp7 can be matched to switch Mp3 in the driving circuit because they are the same type of MOSFET (PMOS) and when they pass current on each alternating cycle they work at a similar bias condition. Their size can be matched so as to equalize current on each alternating cycle, i.e., the current flowing through switches Mn4, Mp7 in one half of a cycle is similar in magnitude to the current flowing through switches Mp3, Mp6 in the other half of the cycle.

Figure 11:
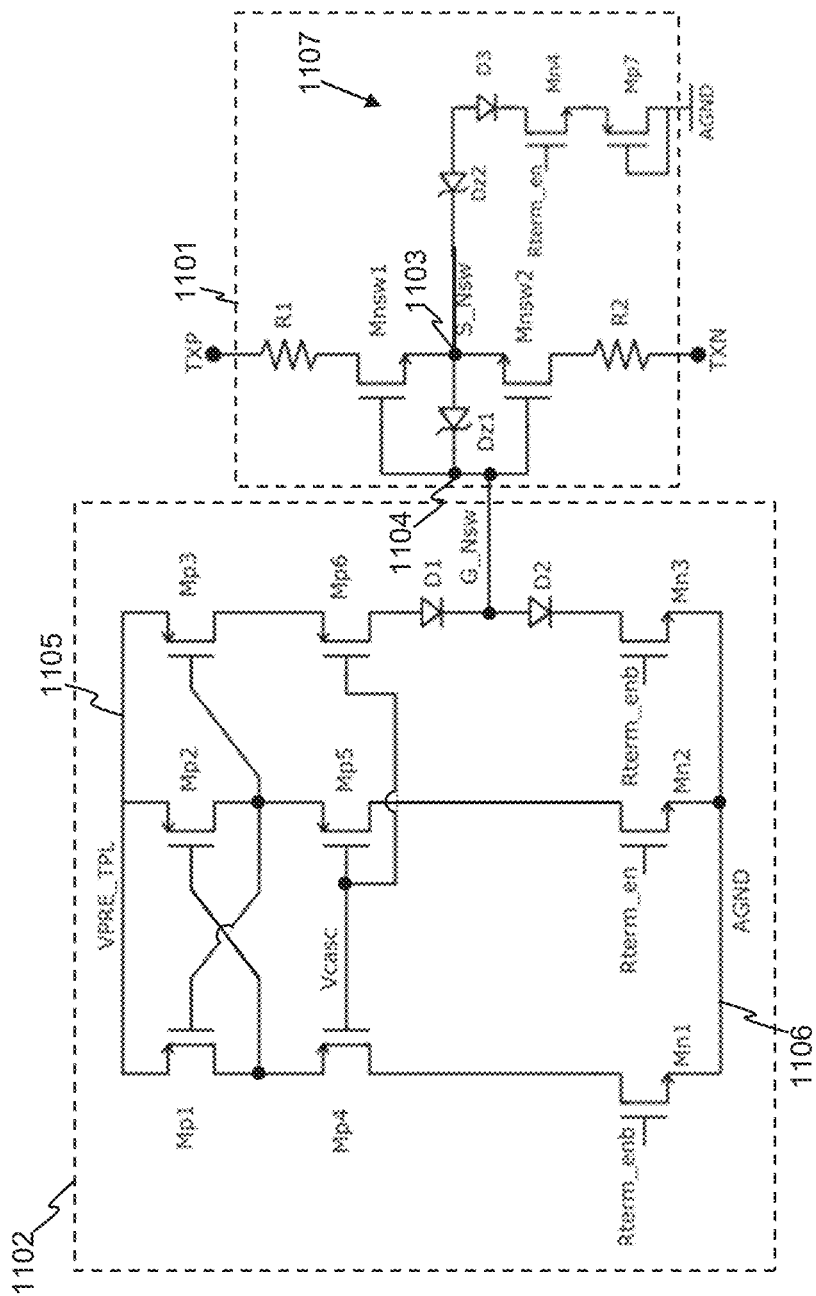
FIG. 11 is a schematic diagram of an example switchable termination resistance circuit and associated driving circuit.

In the example illustrated in FIG. 11, the cathode of the second Zener diode Dz2 is connected to the midpoint node 1103, the anode of the branch diode D3 is connected to the anode of the second Zener diode Dz2, the drain of the branch NMOS switch Mn4 is connected to the cathode of the branch diode D3, the source of the branch PMOS switch Mp7 is connected to the source of the branch NMOS switch Mn4 and the gate and drain of the branch PMOS switch are connected to ground AGND. Other series arrangements of the components of the branch 1107 may also achieve the same effect. The Zener diode Dz2 and diode D3 may, for example, be in reverse order to that shown in FIG. 11 without affecting the function of the branch circuit 1107.

Figure 12:
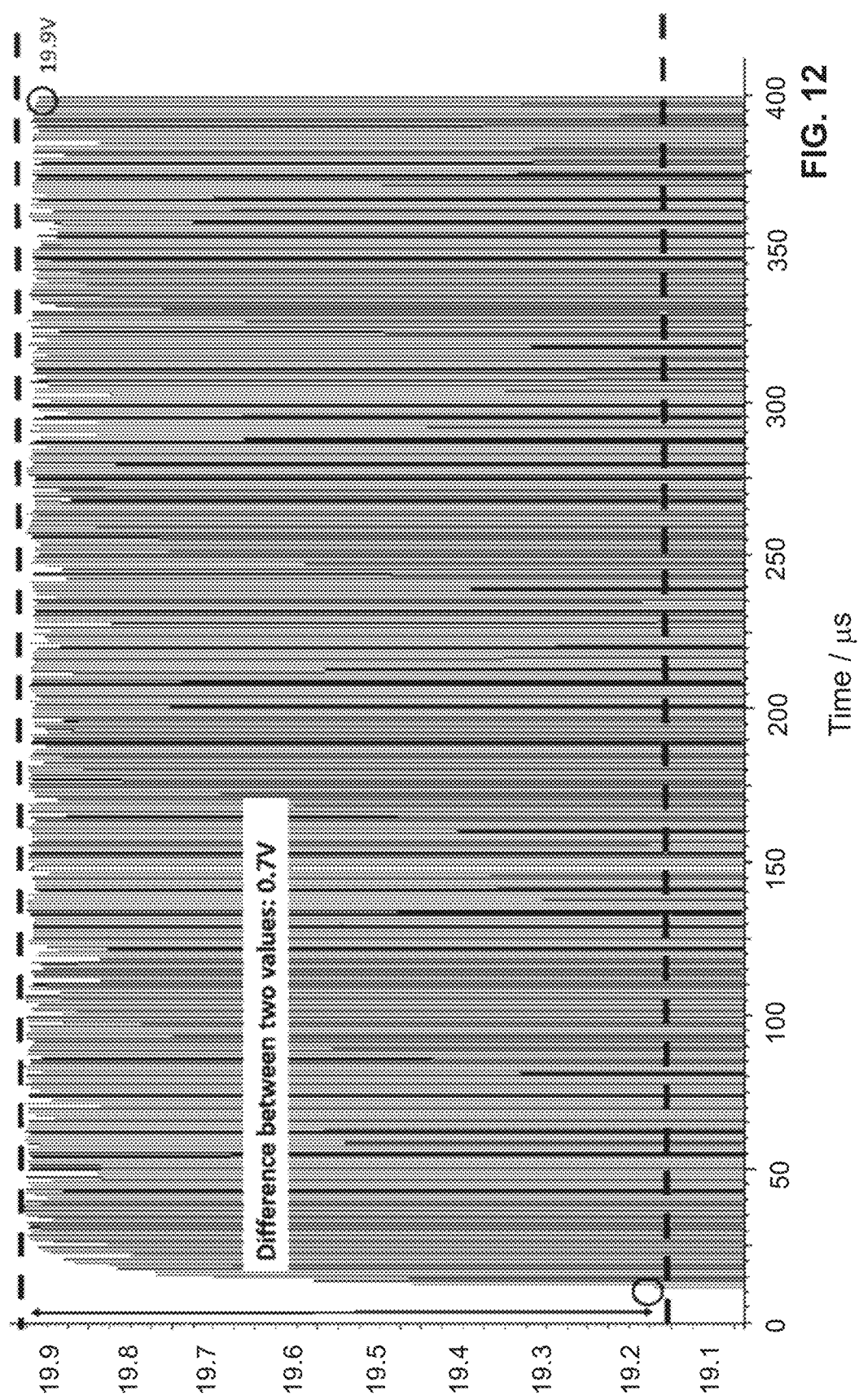
FIG. 12 is a plot of voltage as a function of time for a terminal of an example capacitively isolated transceiver.

The effect of the branch 1107 on operation of the transceiver is illustrated in FIG. 12, which shows the voltage V_TXP 1201 as a function of time. Compared with the results shown in FIG. 9, the increase in voltage is reduced substantially to only around 0.7V on the transmitter side. A similar effect is also obtained on the receiver side, where a reduction to around 0.5V above nominal is achieved. The amount of reduction can be adjusted by adjusting the size of the switches Mn4 and Mp7.

An advantage therefore of the branch 1107 as part of the termination resistance switch 1101 is that the voltage across the transmission line can be kept within desired limits in the presence of electromagnetic interference, thereby reducing the possibility of damage to components in the transceivers and allowing lower voltage components to be used, which reduces the size required on an integrated circuit die.

Figure 13:
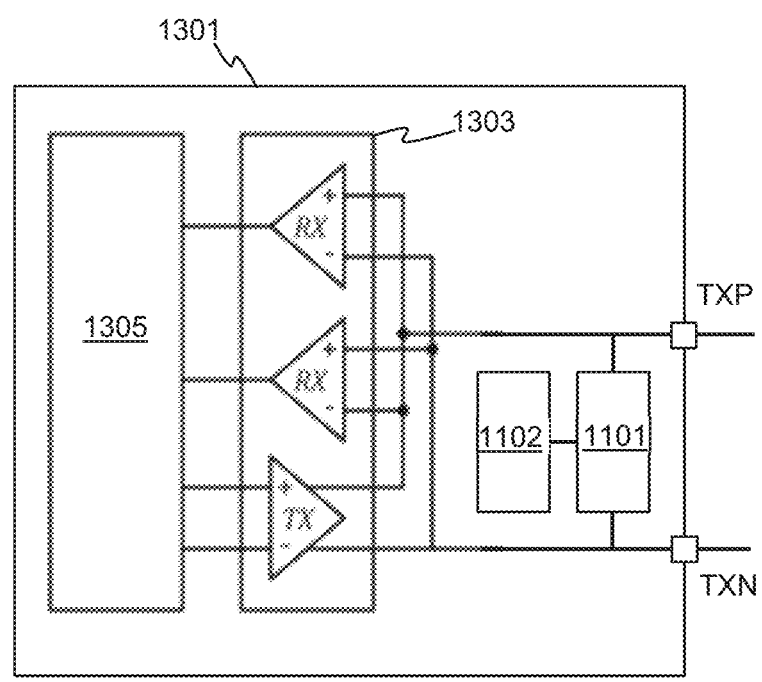
FIG. 13 is a schematic diagram of an example transceiver incorporating the switchable termination resistance circuit and driving circuit of FIG. 11.

FIG. 13 is a schematic diagram of an example transceiver 1301 with a switchable termination resistance circuit 1101 of the type described above. The transceiver 1301 comprises a control module 1305 configured to provide signals to and receive signals from an amplifier module 1303, which is similar to that described above in relation to FIG. 8, i.e., with two receiver amplifiers RX and one transmitter amplifier TX. The amplifier module 1303 is connected to terminals TXP, TXN for connection to a transmission line, for example a capacitively isolated transmission line of the type shown in FIG. 8. The switchable termination resistance circuit 1101 is connected between the terminals TXP, TXN. The driving circuit 1102 is configured to provide a gate driving voltage to the switchable termination resistance circuit 1101 to switch the circuit 1101 on and off. Operation of the driving circuit 1102 is controlled by the control module 1305, which provides a termination resistance enable signal Rterm_en (and its inverse Rterm_enb) to the driving circuit 1102.

Figure 14:
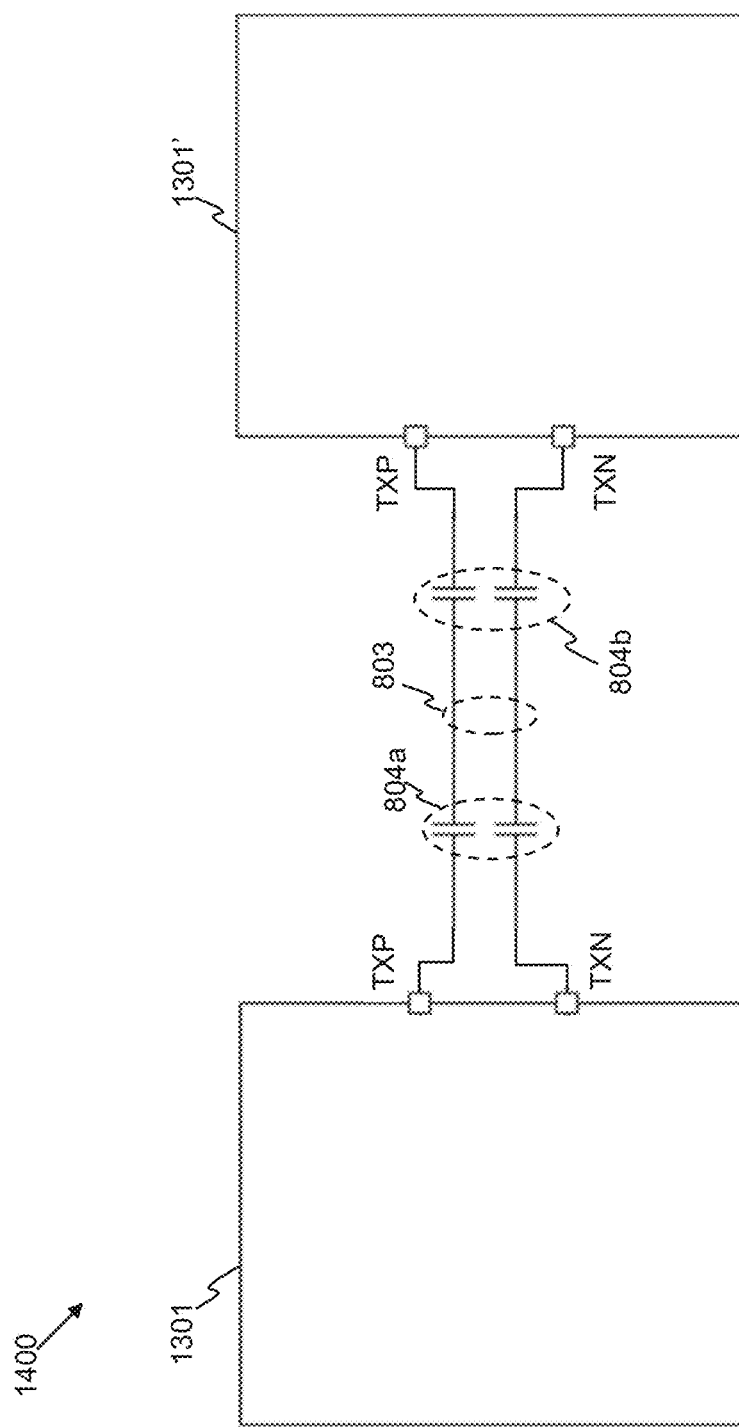
FIG. 14 is a schematic diagram of an example transmission system.

A simplified transmission system 1400 is illustrated schematically in FIG. 14. The transmission system 1400 comprises first and second transceivers 1301, 1301' of the type described above in relation to FIG. 13. Each transceiver 1301, 1301' comprises first and second terminals TXP, TXN connected to respective ends of a transmission line 803. The transmission line 803 comprises pairs of capacitors 804a, 804b at each end to isolate the transceivers 801, 802 from the transmission line 803.

Figure 15:
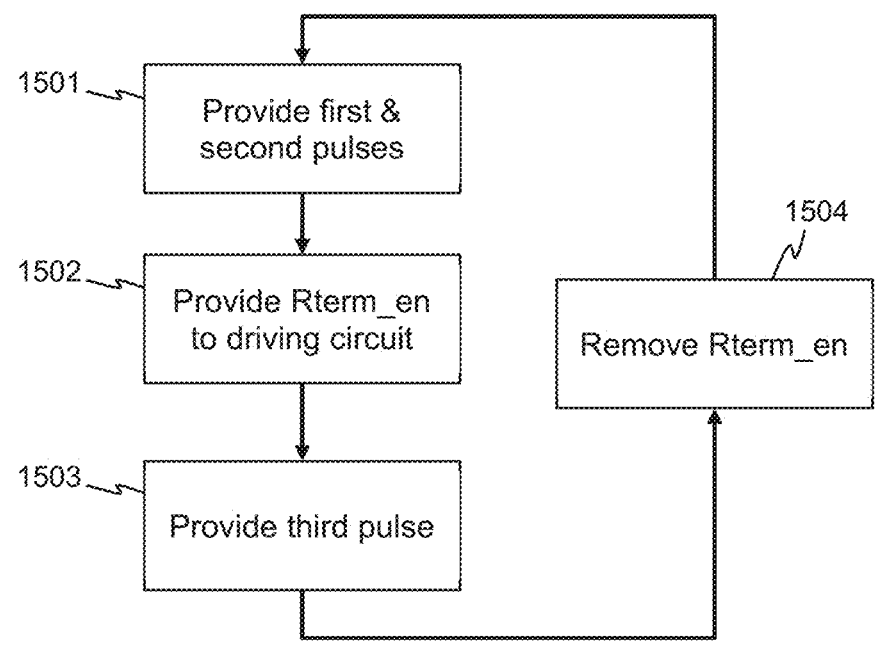
FIG. 15 is a schematic flow diagram illustrating a method of operating an example transmission system.

FIG. 15 is a schematic flow diagram illustrating a series of method steps describing operation of the transmission system. In a first step 1501, first and second pulses are provided to the amplifier module for transmission. In a second step 1502, following transmission of the first and second pulses, the termination resistance enable signal Rterm_en is provided to the driving circuit (together with its inverse, Rterm_enb) and in a third step 1503 the third pulse is provided. The process then repeats for transmission of each subsequent data bit, with the termination resistance enable signal Rterm_en removed (step 1504) prior to providing subsequent first and second pulses for the subsequent data bit.

The transmission system described herein may be particularly applicable in battery management systems, for example for vehicle battery systems, in which isolated electrical communication is required, current consumption is a critical parameter and electromagnetic interference may be high. The transmission system described herein may also be applicable in other applications where isolated transmission with a low current consumption, particularly in the presence of high electromagnetic interference, may be required.

From reading the present disclosure, other variations and modifications will be apparent to the skilled person. Such variations and modifications may involve equivalent and other features which are already known in the art of transmission line transceivers, and which may be used instead of, or in addition to, features already described herein.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub-combination. The applicant hereby gives notice that new claims may be formulated to such features and/or combinations of such features during the prosecution of the present application or of any further application derived therefrom.

For the sake of completeness, it is also stated that the term "comprising" does not exclude other elements or steps, the term "a" or "an" does not exclude a plurality, a single processor or other unit may fulfil the functions of several means recited in the claims and reference signs in the claims shall not be construed as limiting the scope of the claims.

The invention claimed is:

1. A switchable termination resistance circuit for a transmission line transceiver, the switchable termination resistance circuit comprising:
   first and second terminals for connection to a transmission line;
   first and second NMOS termination resistance switches having source connections connected together at a midpoint node and gate connections connected to an input node;
   a first resistor connected between the first terminal and a drain connection of the first NMOS termination resistance switch;
   a second resistor connected between the second terminal and a drain connection of the second NMOS termination resistance switch;
   a Zener diode having a cathode side connected to the input node and an anode side connected to the midpoint node; and
   a branch comprising a second Zener diode, a branch diode, a branch NMOS switch and a branch PMOS switch in a series connected arrangement between the midpoint node and a ground line.

2. The switchable termination resistance circuit of claim 1, wherein a cathode of the second Zener diode is connected to the midpoint node, an anode of the branch diode is connected to an anode of the second Zener diode, a drain of the branch NMOS switch is connected to a cathode of the branch diode, a source of the branch PMOS switch is connected to a source of the branch NMOS switch and a gate and drain of the branch PMOS switch are connected to the ground line.

3. A transceiver comprising:
   first and second terminals for connection to a transmission line;
   a control module;
   an amplifier module connected between the control module and the first and second terminals;
   a switchable termination resistance circuit according to claim 1 connected between the first and second terminals; and
   a driving circuit configured to provide a gate voltage to the input node of the switchable termination resistance circuit,
   wherein the control module is configured to provide signals to and from the amplifier module and a termination resistance enable signal to the driving circuit.

4. The transceiver of claim 3, wherein the driving circuit comprises:
   a first diode connected between a supply voltage line and the input node, the first diode having a cathode connected to the input node; and
   a second diode connected between the input node and a ground voltage line, the second diode having an anode connected to the input node.

5. The transceiver of claim 4, wherein the driving circuit comprises first, second and third NMOS switches having source connections connected to the ground voltage line, the control module connected to provide the termination resistance enable signal to the gate of the second NMOS switch and to a gate of the branch NMOS switch and an inverse of the termination resistance enable signal to the gates of the first and third NMOS switches, the drain of the third NMOS switch connected to a cathode of the second diode.

6. The transceiver of claim 5, wherein the driving circuit comprises first, second, third, fourth, fifth and sixth PMOS switches, wherein:
   a gate connection of the first PMOS switch is connected to a drain connection of the second PMOS switch;
   a gate connection of the second PMOS switch is connected to a drain connection of the first PMOS switch;
   source connections of the first, second and third PMOS switches are connected to the supply voltage line;
   a gate connection of the third PMOS switch is connected to the drain connection of the second PMOS switch;
   a source connection of the fourth PMOS switch is connected to the drain connection of the first PMOS switch;
   a drain connection of the fourth PMOS switch is connected to a drain connection of the first NMOS switch;
   a gate connection of the fourth PMOS switch is connected to a gate connection of the fifth PMOS switch;
   a source connection of the fifth PMOS switch is connected to the drain connection of the second PMOS switch;
   a drain connection of the fifth PMOS switch is connected to a drain connection of the second NMOS switch;
   gate connections of the fifth and sixth PMOS switches are connected together;
   a source connection of the sixth PMOS switch is connected to a drain connection of the third PMOS switch; and
   a drain connection of the sixth PMOS switch is connected to an anode connection of the first diode.

7. The transceiver according to claim 3, wherein the transceiver comprises a plurality of switchable termination resistance circuits connected in parallel between the first and second terminals.

8. A transmission system comprising:
first and second transceivers according to claim 3; and
a transmission line connected to first and second terminals of each of the first and second transceivers.

9. The transmission system of claim 8, wherein the transmission line comprises first and second pairs of capacitors at each end to isolate the first and second transceivers from the transmission line.

10. A method of operating a transceiver, the transceiver comprising:
first and second terminals connected to the transmission line;
a control module;
an amplifier module connected between the control module and the first and second terminals;
a switchable termination resistance circuit connected between the first and second terminals; and
a driving circuit configured to provide a gate voltage to the input node of the switchable termination resistance circuit,
wherein the switchable termination resistance circuit comprises:
first and second NMOS termination resistance switches having source connections connected together at a midpoint node and gate connections connected to an input node;
a first resistor connected between the first terminal and a drain connection of the first NMOS termination resistance switch;
a second resistor connected between the second terminal and a drain connection of the second NMOS termination resistance switch;
a Zener diode having a cathode side connected to the input node and an anode side connected to the midpoint node; and
a branch comprising a second Zener diode, a branch diode, a branch NMOS switch and a branch PMOS switch in a series connected arrangement between the midpoint node and a ground line,
the method comprising transmitting a data bit over the transmission line by:
the control module providing first and second pulses to the amplifier module to drive respective positive and negative differential voltage levels across the first and second terminals, during respective first and second time periods; and
the control module providing a termination resistance enable signal to the driving circuit and, while the termination resistance enable signal is provided, maintaining a zero differential voltage level across the first and second terminals, during a third time period.

11. The method of claim 10, further comprising:
the control module removing the termination resistance enable signal from the driving circuit; and
repeating the method for transmission of a subsequent data bit over the transmission line.

12. The transceiver of claim 3, wherein a cathode of the second Zener diode is connected to the midpoint node, an anode of the branch diode is connected to an anode of the second Zener diode, a drain of the branch NMOS switch is connected to a cathode of the branch diode, a source of the branch PMOS switch is connected to a source of the branch NMOS switch and a gate and drain of the branch PMOS switch are connected to the ground line.

* * * * *